(12) United States Patent
Watanabe

(10) Patent No.: US 6,731,708 B1
(45) Date of Patent: May 4, 2004

(54) CLOCK SIGNAL CONTROL DEVICE

(75) Inventor: Mitsuhiro Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/212,471

(22) Filed: Dec. 16, 1998

(30) Foreign Application Priority Data

Dec. 17, 1997 (JP) .......................................... 10-364078

(51) Int. Cl.$^7$ ................................................. H03L 7/00
(52) U.S. Cl. ...................... 375/357; 327/299; 327/295; 713/500
(58) Field of Search .......................... 375/357; 327/291, 327/299, 142, 143, 160, 162, 165, 295; 713/300, 500, 502, 503

(56) References Cited

U.S. PATENT DOCUMENTS

| | | | | |
|---|---|---|---|---|
| 5,459,418 A | * | 10/1995 | Uriya et al. ................ | 327/105 |
| 5,535,067 A | * | 7/1996 | Rooke ......................... | 360/51 |
| 5,936,452 A | * | 8/1999 | Utsuno et al. ............... | 327/142 |
| 6,085,327 A | * | 7/2000 | Seng et al. .................. | 307/3 |
| 6,343,334 B1 | * | 1/2002 | Uemura et al. .............. | 710/10 |

FOREIGN PATENT DOCUMENTS

| | | |
|---|---|---|
| JP | 62-86419 | 4/1987 |
| JP | 62-289012 | 12/1987 |
| JP | 63-211919 | 9/1988 |
| JP | 63-224514 | 9/1988 |
| JP | 63-245010 | 10/1988 |
| JP | 3-165617 | 7/1991 |
| JP | 3-165619 | 7/1991 |
| JP | 4-25958 | 1/1992 |
| JP | 9-134593 | 5/1997 |

OTHER PUBLICATIONS

Japanese Office Action, dated Feb. 23, 2000, with English language translation of Japanese Examiner's comments.

* cited by examiner

*Primary Examiner*—Amanda T. Le
(74) *Attorney, Agent, or Firm*—Whitham, Curtis & Christofferson, P.C.

(57) ABSTRACT

Disclosed is a clock signal control device which has: an oscillator which generates a clock signal; a pulse detecting circuit which detects the frequency or duty of the clock signal and outputs a control signal based on the result of detection; and a clock signal supply selecting circuit which generates a supply clock signal from the clock signal generated from the oscillator in response to the control signal from the pulse detecting circuit.

110 Claims, 12 Drawing Sheets

CLOCK SIGNAL CONTROL DEVICE

FIELD OF THE INVENTION

This invention relates to control of clock signal operation, and more particularly to, a clock signal control device to prevent the wrong operation of system due to unstable operation of clock signal that may occur when the power supply of an electronic device, such as a portable terminal, is turned on.

BACKGROUND OF THE INVENTION

In an information storage device driven by AC power supply, such as a desktop personal computer, data necessary to the application program are stored into storage, such as hard disk. Thus, even when power supply to the information storage device is turned off, no data is lost. However, in a portable information storage device driven by dry cell, a hard disk that consumes too much power cannot be used.

Therefore, a non-volatile memory device, such as EEPROM or flash memory, is used therein to retain data. Also there are devices that turn off the power supply after data are stored into memory. However, the non-volatile memory devices are generally expensive, considering the cost per memory capacity. Thus a self-refresh type device, a volatile memory such as DRAM, is commonly used. In a unit using a DRAM type device, the clock signal is stopped to end the signal change of the device, while still supplying power. Thereby, the power off state is built.

Also, even in a unit where the content of memory is not necessary to retain, there may occur the case that power supply to the unit needs to be turned off while retaining the state of signal in respective circuits of the unit. For such a case, supplying of the clock signal to the unit is stopped to end the operation of the device, while supplying power. Thereby, the power OFF state of the unit is built.

In any case, to build the power OFF state, power supplying to an oscillator as oscillation source is ended to stop the clock signal.

However, when the operation again starts after stopping the clock signal, the clock signal may become unstable, as the case may be, causing the wrong operation and coming to failure in the unit operation. So, it is necessary to avoid the wrong operation due to the clock signal to restart stably the unit.

Japanese patent application laid-open Nos. 62-86419 (1987) and 4-25958 (1992) (hereinafter referred to as 'prior art 1' and 'prior art 2', respectively) disclose a system using CPU that operates synchronizing with the clock signal. In this system, the start of operation is delayed by a delay buffer after turning on the power supply, and the system operation starts after the clock signal becomes stable. Thereby, the wrong operation when turning on the power supply is turned on can be avoided.

Japanese patent application laid-open No. 6-101452 (1994) (hereinafter referred to as 'prior art 3') disclose a method where the oscillation of oscillator is counted until the clock signal is stabilized, in order to avoid the wrong operation due to unstable clock signal when turning on the power supply. By thus keeping the system suspended until counting a given value, the wrong operation due to unstable clock signal when turning on the power supply can be avoided.

Also, Japanese patent application laid-open No. 8-316832 (1996) (hereinafter referred to as 'prior art 4') discloses a method where a D flip-flop, instead of a capacitor, is used to detect the locking state of a PLL circuit to generate a clock signal to be supplied to semiconductor integrated circuit.

Japanese patent application laid-open No. 3-165617 (1996) (hereinafter referred to as 'prior art 5') discloses a method where the pseudo-clock signal is generated by a CR oscillator only at the initial stage so as to not get the operation clock signal in the unstable stage of oscillation, e.g., when turning on the power supply.

Japanese patent application laid-open No. 3-165619 (1996) (hereinafter referred to as 'prior art 6') discloses a method where for the purpose of solving the wrong operation of system due to unstable operation of clock signal at the initial stage, e.g., when turning on the power supply, the circuit is operated using the output of CR oscillator, which has a faster oscillation-starting time than a quartz oscillator, until the oscillation of the quartz oscillator as a true system clock signal starts. Detecting the time when the quartz oscillator starts to oscillate, the clock signal to be supplied to the system is replaced by the output of the quartz oscillator.

Japanese patent application laid-open No.9-134593 (1997) (hereinafter referred to as 'prior art 7') discloses a method where there are disposed several flip-flops thereby initialization signal is output when several clock pulses are input.

The problems of the above prior arts 1 to 7 are as follows: Prior arts 1 and 2 employ the method that the start timing of system operation is delayed by a few counts of clock signal by the counter. Thus, the clock signal is also supplied to the counter to count the amount of delay. Therefore, the counter taking a timing when turning on the power supply or when restarting the operation from the suspended state of clock signal may also be influenced by the unstable state of clock signal operation, thereby running into the wrong operation.

In prior art 3, like the cases of prior arts 1 and 2, a reset signal to be input to the system is generated by using the counter and the operation of the circuit is delayed by this reset signal during a certain period. Thus, by keeping the circuit suspended during the unstable period of oscillator such as just after turning on the power supply, the wrong operation is prevented. However, in this system, the clock signal of the oscillator is supplied to the counter to make the delay, the counter may run into the wrong operation during the unstable period of oscillator such as just after turning on the power supply.

In prior art 4, a reference frequency circuit is used to detect the locking of PLL. The reference frequency circuit necessary for the frequency locking of PLL needs to have stabilized oscillation before the oscillator that supplies the clock signal starts to oscillate. Therefore, the reference frequency circuit needs to be continuously oscillating, or to start to oscillate before the oscillator that supplies the clock signal starts to oscillate such that it is already oscillating when the oscillator starts to oscillate. Also, to check the frequency locking by phase comparison, a further circuit such as a phase comparator or VCO is necessary. Thus, there is the problem that the entire circuit is complicated.

In prior arts 5 and 6, an oscillator, which has a faster oscillation-starting timing than the actually-used oscillator, is used at the initial stage of operation, and when the oscillation of the actually-used oscillator becomes stable, the system is operated replacing the initial-stage oscillator by the actually-used oscillator. However, even when the initial-stage oscillator has a faster oscillation-starting timing than the quartz oscillator, it may be unstable when turning on the power supply. Eventually, there still exists the problem that the wrong operation of circuit can occur when turning on the power supply.

SUMMARY Of The INVENTION

Accordingly, it is an object of the invention to provide a clock signal control device by which a system can surely start the stable operation when it restarts.

It is a further object of the invention to provide a clock signal control device that has a simplified circuit composition advantageous to high integration, as well as the stability when restarting the system.

It is a still further object to provide a clock signal control device with a simplified circuit composition that can avoid the wrong operation of circuit due to unstable operation of clock signal when turning on the power supply.

According to the invention, a clock signal control device, comprising:

an oscillator which generates a clock signal;
a pulse detecting circuit which detects the frequency or duty of the clock signal and outputs a control signal based on the result of detection; and
a clock signal supply selecting circuit which generates a supply clock signal from the clock signal generated from the oscillator in response to the control signal from the pulse detecting circuit.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
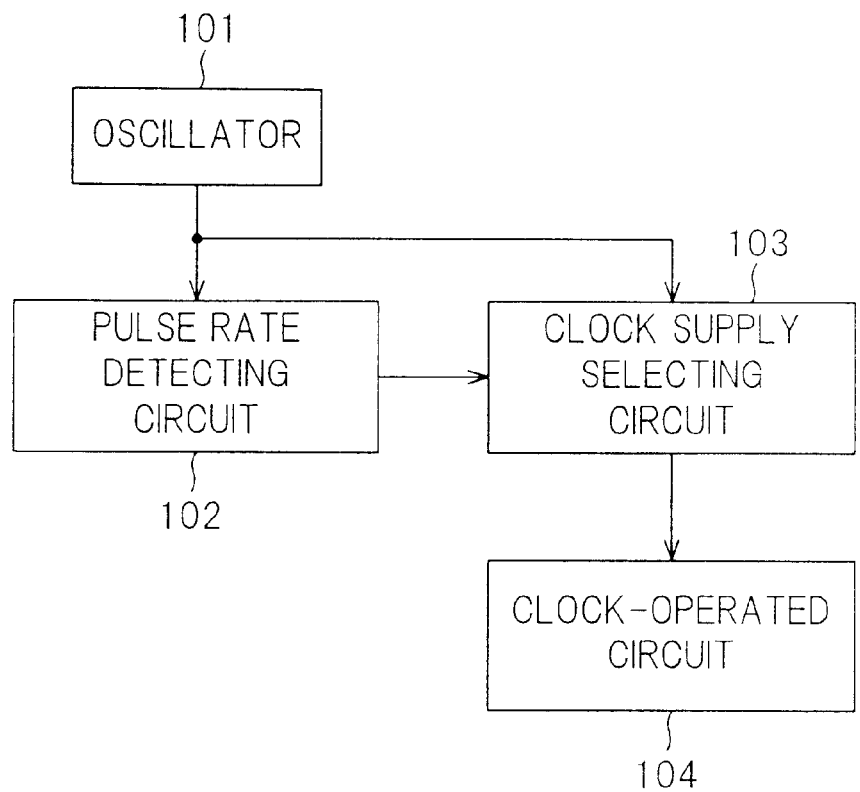
FIG. 1 is a block diagram showing the composition of a clock signal control device in a first preferred embodiment according to the invention.

A clock signal control device, which is suitably applied to an electronic device, such as a portable telephone, in the preferred embodiments of the invention will be explained below, referring to the drawings.

FIG. 1 shows the composition of a clock signal control device in the first preferred embodiment of the invention. In FIG. 1, the clock signal control device in the first embodiment comprises an oscillator 101, a pulse rate detecting circuit (pulse detecting circuit) 102, a clock signal supply selecting circuit 103, and a clock-signal-operated circuit 104.

The clock-signal-operated circuit 104 means a circuit whose operation is determined in response to a clock signal, i.e., a unit such as CPU (central processing unit) that operates by the supply of clock signal.

The oscillator 101 comprises a circuit to oscillate in a constant cycle, such as a crystal oscillator, a CR oscillator, a SAW (surface acoustic wave) oscillator etc. However, it may be any circuit with electrical oscillation.

The pulse rate detecting circuit 102 detects a ratio of low-level time width and high-level time width in oscillation of the oscillator, i.e., a duty ratio.

The clock signal supply selecting circuit 103 determines whether to supply a clock signal as output of the oscillator 101 to the clock-signal-operated circuit 104 or not, based on the output result of the pulse rate detecting circuit 102.

Figure 2:
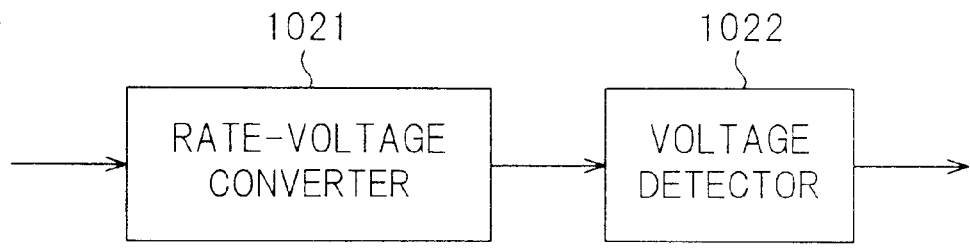
FIG. 2 is a block diagram showing a composition of a pulse rate detecting circuit 102 in FIG. 1.

The pulse rate detecting circuit 102, as shown in FIG. 2, comprises a rate-voltage converter 1021 and a voltage detector 1022. The rate-voltage converter 1021 is a circuit to detect a rate of high level and low level in clock signal as output of the oscillator 101. The rate-voltage converter outputs a higher voltage as the ratio of high level is increased. The voltage detector 1022 outputs a control signal to indicate 'valid' when the output voltage of the rate-voltage converter 1021 is higher than a predetermined level.

To stand a variation of level to some extent, it is desirable that the voltage detector 1022 uses a comparator with hysteresis characteristic. Although the rate-voltage converter 1021 averages up outputs of the oscillator 101, this voltage is always varied. Therefore, when a normal comparator without hysteresis characteristic is used as the rate-voltage converter 1021, there may occur wrong operation near a detected value of voltage.

Figure 3:
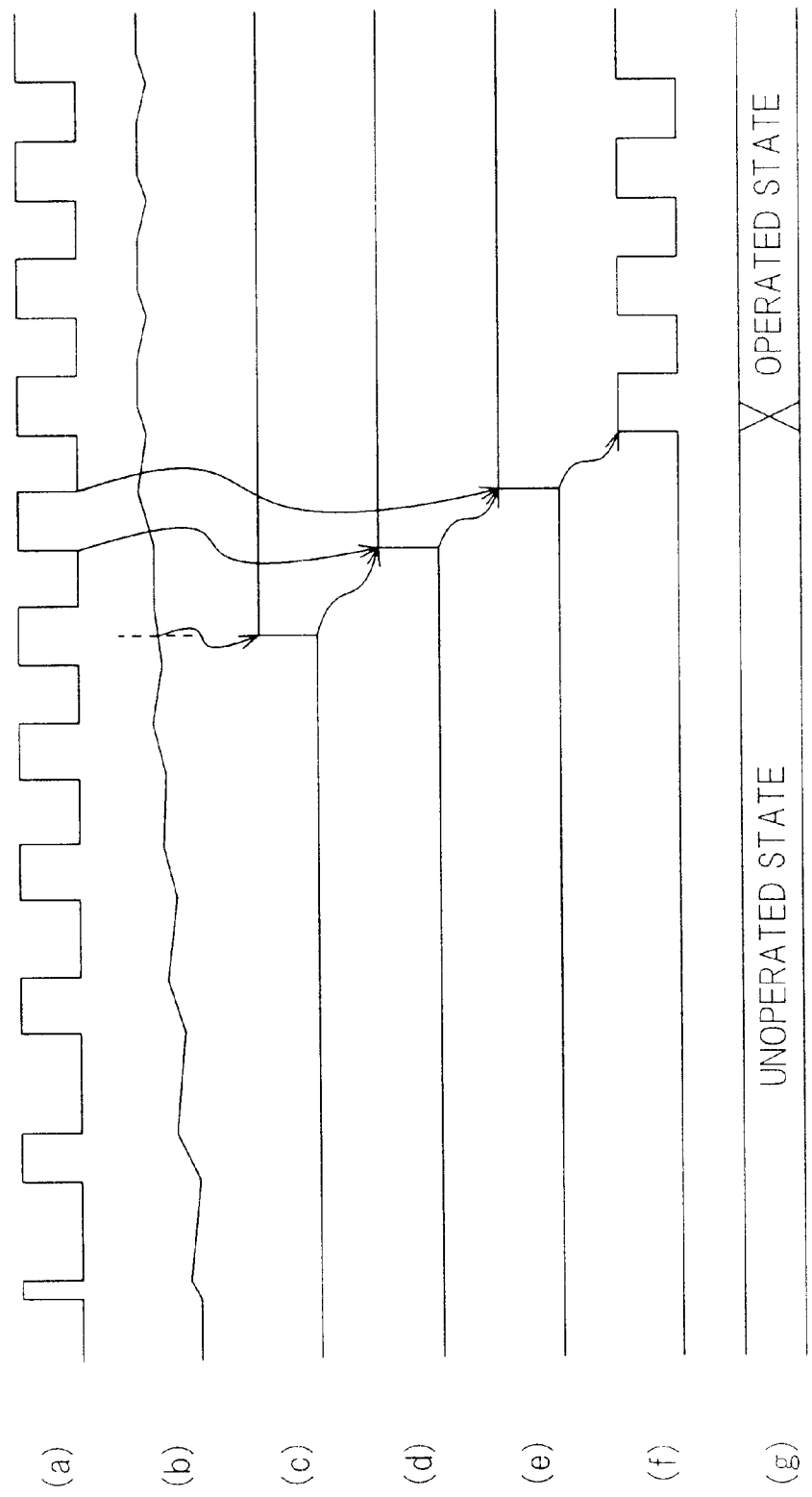
FIG. 3 is a timing chart showing the operations of the clock signal control device in the first embodiment.

Next, referring to the block diagram in FIG. 1 and a timing chart in FIG. 3, the operation of the clock signal control device in the first embodiment of the invention will be explained. In FIG. 3, (a) shows an output of oscillator, (b) shows an output of the rate-voltage converter, (c) shows a pulse rate detection signal, (d) shows an internal signal Am the clock signal supply selecting circuit, (e) shows an internal signal B in the clock signal supply selecting circuit, and (f) shows state of the clock-signal-operated circuit.

The oscillator 101, as shown in FIG. 3(a), starts to oscillate when an external power supply is supplied. The control of this power supply may use of any type. For example, the power supply maybe controlled by a manual switch, or when the clock signal control device is driven by dry cell, a cell remaining amount detector may control the power supply according to a remaining amount of cell.

The output of the pulse rate detecting circuit 102, as shown in FIG. 3(b), is varied with the oscillation frequency of the oscillator 101. The pulse rate detecting circuit 102 has a high output value when the oscillation frequency of the oscillator 101 is high and a low output value when the oscillation frequency of the oscillator 101 is low. Just after turning on the power supply, the output of the oscillator 101 is unstable and the oscillator 101 oscillates with a low frequency. Thereafter, when the operation becomes stable, the oscillator 101 starts to oscillate with a frequency proper to the oscillator 101. The rate-voltage converter 1021 in the pulse rate detecting circuit 102 presents a low output value just after turning on the power supply because the frequency of the oscillator 101 is low. It gradually presents a high output value with an increase in the frequency of the oscillator 101.

The voltage detector 1022 in the pulse rate detecting circuit 102, as shown in FIG. 3(c), outputs a control signal to indicate that the oscillator 101 are stably oscillating when the output of the rate-voltage converter 1021 exceeds a predetermined level. The clock signal supply selecting circuit 103, as shown in FIGS. 3(d), (e), (f), starts to supply the clock-signal-operated circuit 104 with clock signal, in response to the control signal.

The clock-signal-operated circuit 104, as shown in FIG. 3(g) shifts from unoperated state into operated state when clock signal is supplied from the clock signal supply selecting circuit 103.

The clock signal supply selecting circuit 103 not only uses the output signal of the pulse rate detecting circuit 102 as a control signal for selection, but also supplies the clock-signal-operated circuit 104 with clock signal while synchronizing with the output of the oscillator 101 in response to the control signal.

Next, referring to FIGS. 4, 5, 6 and 7, the composition of the clock signal control device of the invention will be explained in detail.

Figure 4:
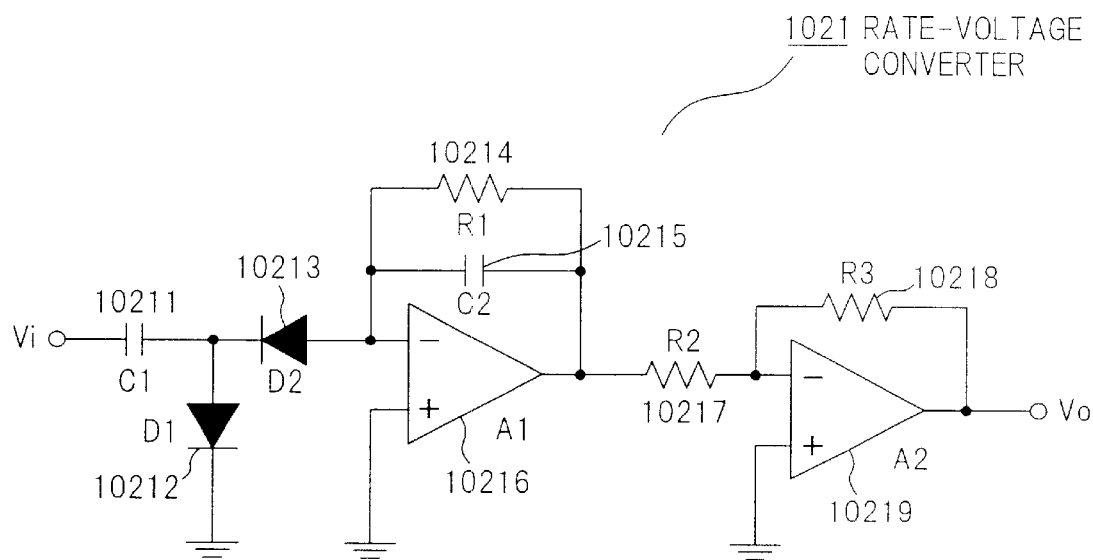
FIG. 4 is a circuit diagram showing a specific composition of a rate-voltage converter 1021 in FIG. 2.

FIG. 4 shows an example of the rate-voltage converter 1021, which is part of the pulse rate detecting circuit 102. The rate-voltage converter 1021 is composed of a pump circuit, an averaging circuit and an inversion circuit.

The pump circuit is composed of a capacitor C1 10211, a diode D1 10212 and a diode D2 10213. The averaging circuit is composed of a resistor R1 10214, a capacitor C2 10215 and an operational amplifier A1 10216. The inversion circuit is composed of resistors R2 10217 and R3 10218, and an operational amplifier A2 10219.

The diode D2 10213 and diode D1 10212 are connected in series, and the anode of the diode D2 10213 is connected to the inversion input of the operational amplifier A1 10216. The connection node of the diode D2 10213 and diode D1 10212 is connected with one terminal of the capacitor C1 10211. Voltage Vi is supplied to another terminal of the capacitor C1 10211. The non-inversion input of the operational amplifier A1 10216 is grounded. Between the inversion input and the output of the operational amplifier A1 10216, a parallel circuit of the resistor R1 10214 and capacitor C2 10215 is connected. The output of the operational amplifier A1 10216 is connected through the resistor R2 10217 to the inversion input of the operational amplifier A2 10219. Between the inversion input and the output of the operational amplifier A2 10219, the resistor R3 10218 is connected. The non-inversion input of the operational amplifier A2 10219 is grounded.

The pump circuit is a circuit to charge the capacitor C2 10215. When a voltage of peak value Vi is applied to the capacitor C1, a charge of (Vi*C1) is flown into the capacitor C2. By discharging the capacitor C2 10215 by the resistor 10214, the number of pulse within a certain time is converted into an analogue voltage value.

The time constant of this circuit is determined by the resistor R1 10214 and capacitor C2 10215, and is set to match with the natural frequency of the oscillator. In this invention, such a time constant τ that voltage is reduced to 90% during 1/2 period of the cycle. The integral voltage change by CR, especially a voltage at discharging is given by:

$$Vo=V*\exp(-t/\tau)$$

where V is an average voltage just before discharging, τ is a value of (C2*R1), exp is natural logarithm conversion. For example, when the frequency of oscillator is 1 MHz, the values of the resistor R1 and the capacitor C1 are set to have:

$$\tau=C2*R1=-1/(2*10^6*Ln(90/100))=4.7*10^{-6}$$

For the resistor R1, a value of more than 100 s KΩ is desirable. According to this value, the value of the capacitor C1 is determined. Meanwhile, Ln means the inverse transform of exp.

Also, the inversion output circuit is a circuit to bring the inverted output of the operational amplifier A1 10216 back to the positive output.

Figure 5:
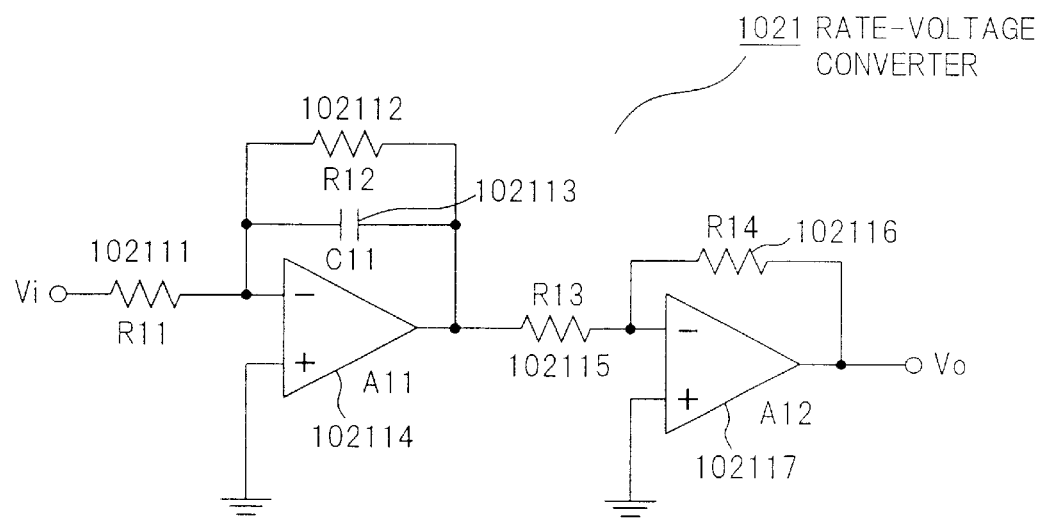
FIG. 5 is a circuit diagram showing another specific composition of the rate-voltage converter 1021 in FIG. 2.

FIG. 5 shows another example of the rate-voltage converter 1021. In this case, the pump circuit in FIG. 4 is not used. It is composed of only an averaging circuit.

Referring to FIG. 5, one terminal of a resistor R11 102111 is connected to the inversion input of an operational amplifier A11 102114. The non-inversion input of the operational amplifier A11 102114 is grounded. Voltage Vi is supplied to another terminal of the resistor R11 102111. Between the inversion input and the output of the operational amplifier A11 102114, a parallel circuit of a resistor R12 102112 and a capacitor C11 102113 is connected. The output of the operational amplifier A11 102114 is connected through a resistor R13 102115 to the inversion input of an operational amplifier A12 102117. Between the inversion input and the output of the operational amplifier A12 102117, a resistor R14 102116 is connected. The non-inversion input of the operational amplifier A12 102117 is grounded.

Although in this circuit the frequency of pulse with inconstant width cannot be accurately measured, in this invention it is not necessary to measure its accurate frequency and need in particular therein is whether it stably oscillates getting to the natural frequency of oscillator or not. Hence, it is on the basis that the pulse width of oscillator is constant when it stably oscillates at the natural frequency.

When the comparator in the voltage detector 1022 detects that a voltage converted by the rate-voltage converter 1021 shown in FIG. 4 becomes higher than a predetermined voltage, the control signal to indicate that the clock signal becomes stable is made 'valid'.

Figure 6:
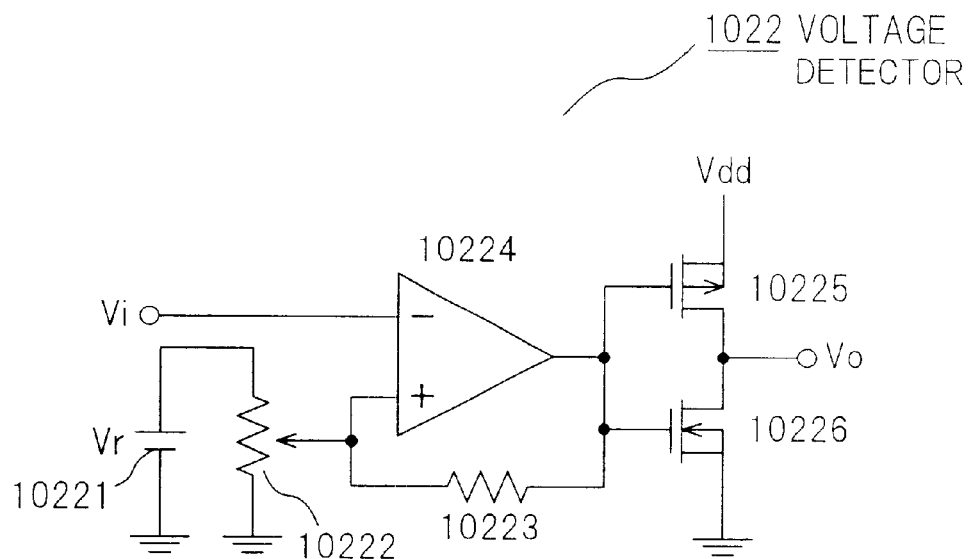
FIG. 6 is a circuit diagram showing a specific composition of a voltage detector 1022 in FIG. 2.

FIG. 6 shows a composition of the voltage detector 1022 to be thus operated. Referring to FIG. 6, the voltage detector 1022 includes a comparator circuit composed of a DC power source Vr 10221, a resistor 10222 and an operational amplifier 10224. However, only with this comparator circuit, there may not be matched with the voltage of a logical circuit following this. So, it is converted into a voltage used in the logical circuit by using a voltage converting circuit composed of a P-channel MOSFET 10225 and an N-channel MOSFET 10226.

Voltage Vi is supplied to the inversion input of the operational amplifier 10224. Between the non-inversion input and the output of the operational amplifier 10224, a resistor 10223 is connected. Also, the non-inversion input of the operational amplifier 10224 is connected a variable resistor 10222. The parallel circuit of the variable resistor 10222 and the DC power source Vr 10221 is connected to the ground. The P-channel MOSFET 10225 and N-channel MOSFET 10226 are in series connected between a power source Vdd and the ground. The output of the operational amplifier 10224 is connected to the gates of the P-channel MOSFET 10225 and N-channel MOSFET 10226. An output Vo is obtained from the midpoint node of the P-channel MOSFET 10225 and N-channel MOSFET 10226.

A feedback circuit of the resistor 10223 in FIG. 6 is a resistor to provide the comparator circuit with hysteresis. In this case, the detection voltage of the comparator circuit when the output voltage Vi of the rate-voltage converter 1021 shifts from low level to high level and the detection voltage of the comparator circuit when the output voltage Vi shifts from high level to low level are different from each other. The former is set to be lower than the latter.

Figure 7:
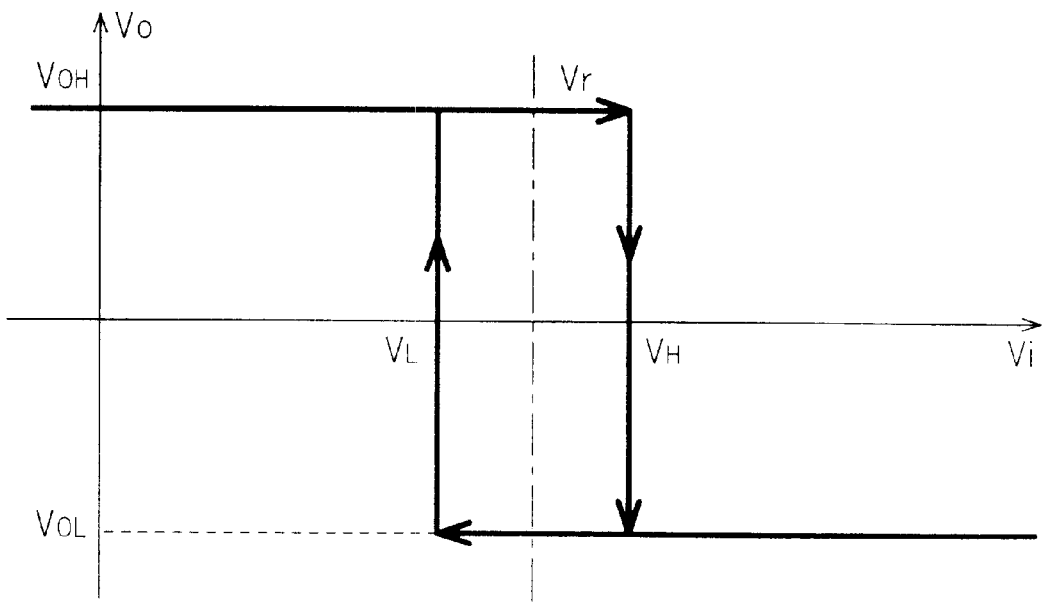
FIG. 7 is a graph showing the hysteresis characteristic of the rate-voltage converter 1021 in FIG. 2

Such a condition is shown in FIG. 7. Here, voltage Vr is set to be higher than the maximum value of the output voltage Vi of the rate-voltage converter 1021, and the sensitivity of the comparator circuit is adjusted by the variable resistor 10222. The sensitivity is adjusted such that the comparator circuit is turned on by a voltage less than the minimum voltage of the output voltage Vi of the rate-voltage converter 1021 in the state that the oscillator oscillates stably.

Figure 8:
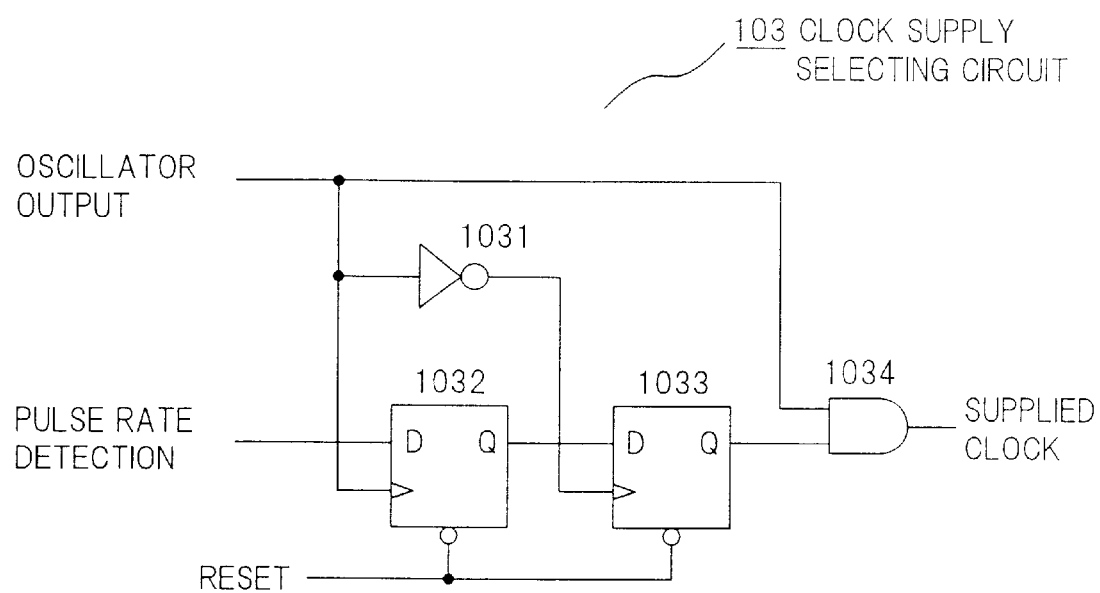
FIG. 8 is a block diagram showing a specific composition of a clock signal supply selecting circuit 103 in FIG. 1.

FIG. 8 shows an example of the clock signal supply selecting circuit 103. Referring to FIG. 8, the output of the pulse rate detecting circuit 102 is supplied to the D input of a D flip-flop 1032. The Q output of the D flip-flop 1032 is connected to the D input of a D flip-flop 1033. Clock signal from the oscillator 101 is directly supplied to the clock terminal of the D flip-flop 1032, also supplied through an inverter 1031 to the clock terminal of the D flip-flop 1033. Reset signal T is supplied to the reset terminals of the D flip-flops 1032 and 1033. The output of the D flip-flop 1033 and clock signal from the oscillator 101 are supplied to an AND gate 1034. The output of the AND gate 1034 is supplied as synchronization signal to the clock-signal-operated circuit 104.

The clock signal supply selecting circuit 103 supplies clock signal to the clock-signal-operated circuit 104 when the output of the pulse rate detecting circuit 102 is 'valid', and stops to supply the clock signal thereto when it is not 'valid'.

In FIG. 8, the D flip-flop 1032, whose clock signal is given by clock signal from the oscillator 101, retains a control signal input from the pulse rate detecting circuit 102 when the clock signal rises, converting it into a signal synchronizing with the clock signal from the oscillator 101, outputting the synchronized signal from the Q terminal. The D flip-flop 1033, whose clock signal is given by the inversion signal of clock signal from the oscillator 101, retains the output of the D flip-flop 1032 when the output of the oscillator 101 falls.

By these circuits, the output of the pulse which was a synchronous to the clock signal from the oscillator 101 can be converted into a signal synchronous to clock signal from the oscillator 101. Then, by carrying out the AND (logical add) operation between the D flip-flop 1033 and clock signal from the oscillator 101, the clock signal is supplied to the clock-signal-operated circuit 104 after the pulse rate detection signal becomes 'valid'.

Also, for both the RESET terminals of the D flip-flops 1032 and 1033, the RESET input is set at low level to reset the Q output because, just after turning on the power supply, the output of the D flip-flops 1032 and 1033 becomes unstable and therefore it is not sure that the Q output becomes high level or low level. The value of the Q output here is at low level. Also, these D flip-flops are of direct reset type, and can be set to the initial state by validating the RESET terminal, regardless of whether clock signal is supplied or not.

Figure 9:
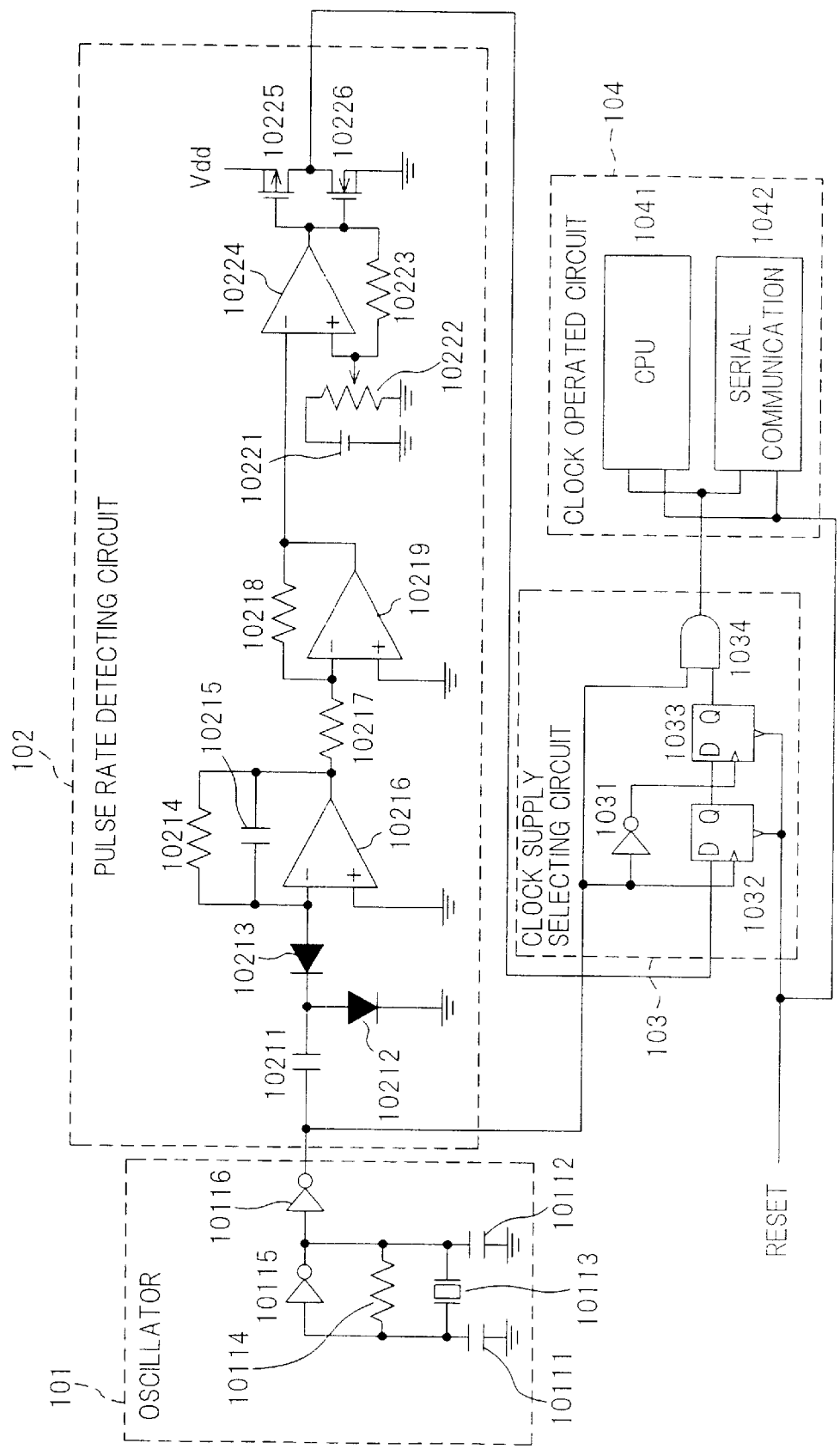
FIG. 9 is a circuit diagram showing an example of the entire composition of the clock signal control device in the first embodiment.

FIG. 9 shows an example of composition of the entire clock signal control device in the first embodiment of the invention where the above-mentioned circuits are used.

In this circuit, the oscillator 101 is composed of capacitors 10111, 10112, a quartz oscillator 10113, a resistor 10114, and NOT(inversion) circuits 10115, 10116. The pulse rate detecting circuit 102, which is a circuit to convert the pulse rate of clock signal output from the oscillator 101 into a voltage, is composed of the rate-voltage converter 1021 comprising the capacitor 10211, diodes 10212, 10213, resistor 10214 and capacitor 10215, operational amplifier 10216, and the voltage detector 1022 comprising the hysteresis comparator including the reference voltage 10221, variable resistor 10222 and operational amplifier 10224, and the P-channel MOSFET 10225 and N-channel MOSFET 10226. The clock signal supply selecting circuit 103, which is a circuit to determine whether to supply clock signal from the oscillator 101 to the clock-signal-operated circuit 104 based on the clock signal of the oscillator 101 and the output of the pulse rate detecting circuit 102, is composed of the inverter circuit 1021, D flip-flops 1032, 1033, and AND circuit 1034. The clock-signal-operated circuit 104 is composed of a circuit that requires clock signal, e.g., CPU 1041 where the output of the clock signal supply selecting circuit 103 is used to operate the circuit, or serial communication 1042. The reset signal, RESET is supplied to CPU 1041 and serial communication 1042 as well as the D flip-flops 1032, 1033.

Next, the operation of the respective circuits in FIG. 9 will be explained, referring to FIG. 3.

First, when the power supply is shut off, the respective circuits are all stopped. Then, when the power supply is turned on and the respective circuits are thereby powered, the RESET signal is at first validated to set the clock signal supply selecting circuit 103 and clock-signal-operated circuit 104 to the initial state.

For a timing to end the resetting, given that the respective circuits of the clock-signal-operated circuit 104 are of direct reset type that can be reset without inputting clock signal, the resetting may be released before a clock signal is supplied from the clock signal supply selecting circuit 103. Alternatively, the resetting may be released after a clock signal is supplied therefrom. However, if a synchronous reset type of flip-flop that requires a clock signal in resetting is included in the clock-signal-operated circuit 104, then such a mechanism that can release the resetting after a clock signal is supplied from the clock signal supply selecting circuit 103 is necessary. An example of circuit composition in such a case is show in FIG. 10.

Figure 10:
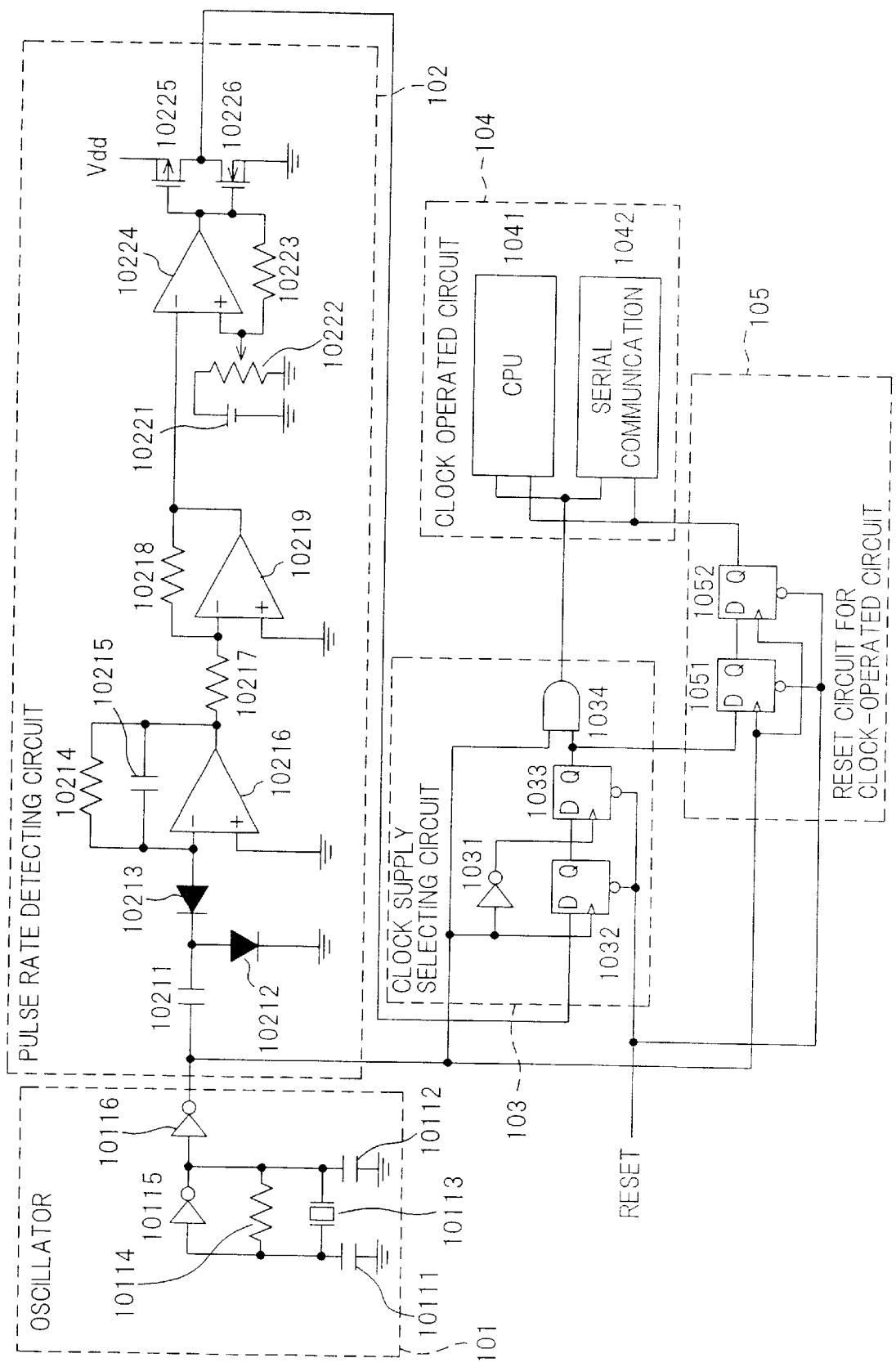
FIG. 10 is a circuit diagram showing another example of the entire composition of the clock signal control device in the first embodiment.

Referring to FIG. 10, in a reset circuit 105 for clock-operated circuit, D input of a D flip-flop 1051 is connected to Q output of the D flip-flop 1033. D input of a D flip-flop 1052 is connected to Q output of the D flip-flop 1051. Clock signal from the oscillator 101 is supplied to the clock terminals of the D flip-flops 1051, 1052. Also, reset signal RESET is supplied to the reset terminals of the D flip-flops 1051, 1052. Q output of the D flip-flop 1052 is supplied to CPU 1041 and serial communication 1042.

As shown in FIG. 3(*a*), the oscillator 101 starts to operate simultaneously when the power supply is turned on. In the initial stage just after turning on the power supply, clock signal of the oscillator 101 is in such a state that its frequency and duty is dispersed and unstable. The oscillation becomes stable with time, starting to oscillate at a time width of high level and a time width of low level in clock signal of nearly 1:1.

On the other hand, the rate-voltage converter 1021 in the pulse rate detecting circuit 102 starts to average clock signal from the oscillator 101. When the oscillator 101 is not stable, the pulse width and number is small, therefore the output of the rate-voltage converter 1021 presents a low voltage, as shown in FIG. 3(b). When the oscillator 101 comes to oscillate stably, the duty of clock signal reaches 50%. Thus, the output voltage of the rate-voltage converter 1021 increases gradually.

Then, when the output of the rate-voltage converter 1021 exceeds a voltage determined by the reference voltage 10221 and variable resistor 10222, the voltage detector 1022 outputs LOW level to indicate that the oscillation of the oscillator 101 becomes stable. As shown in FIG. 3(c), in the pulse rate detecting circuit 102, when the output of the voltage detector 1022 is LOW level, the P-channel MOSFET 10225 turns on, outputting a power source level of Vdd to the clock signal supply selecting circuit 103. In contrast, when not reaching the predetermined voltage, the output of the 1022 presents HIGH level. In this case, as shown in FIG. 3(c), the N-channel MOSFET 10226 turns on, outputting a GND level to the clock signal supply selecting circuit 103.

Also, the voltage detector 1022 with comparator in this circuit has the hysteresis as shown in FIG. 7, allowing a wrong operation not to occur by absorbing by Vr=VH−VL of a variation of the rate-voltage converter 1021.

When the output of the pulse rate detecting circuit 102 becomes HIGH level, the clock signal supply selecting circuit 103 outputs the result of AND operation between a clock signal from the oscillator 101 and the pulse rate detecting circuit 102 at the AND circuit 1034 to the clock-signal-operated circuit 104.

In this case, the output of the pulse rate detecting circuit 102 is not always synchronizing with clock signal from the oscillator 101. So, to avoid the wrong operation of CPU 1041 etc. due to the clock signal supplied, the output of the pulse rate detecting circuit 102 is made to be synchronous with the clock signal at the D flip-flops 1032, 1033 by using the clock signal. Thereby, clock signal with a short width is prevented from being supplied.

Internal signal A of the clock signal supply selecting circuit 103 in FIG. 3(d) shows the output of the D flip-flop 1032, and internal signal B of the clock signal supply selecting circuit 103 in FIG. 3(e) shows the output of the D flip-flop 1033. By carrying out the AND operation between that result and the output of the oscillator 101, supply clock signal 506 in FIG. 3(f) is obtained.

The circuits such as CPU 1041, serial communication 1042 in the clock-signal-operated circuit 104 that require clock signal re operated using the supply clock signal in FIG. 3(f).

For the reset circuit 105 for clock-signal-operated circuit in FIG. 10, by further delaying the output of the D flip-flop 1033 in the clock signal supply selecting circuit 103, the reset signal can be delayed until after clock signal is supplied to the clock-signal-operated circuit 104. Although the clock signal is delayed only by one clock herein, the reset period can be lengthened by adding a further D flip-flop or using a timer circuit that uses a counter, when it is necessary to further be delayed depending on kind of the clock-signal-operated circuit 104.

Figure 11:
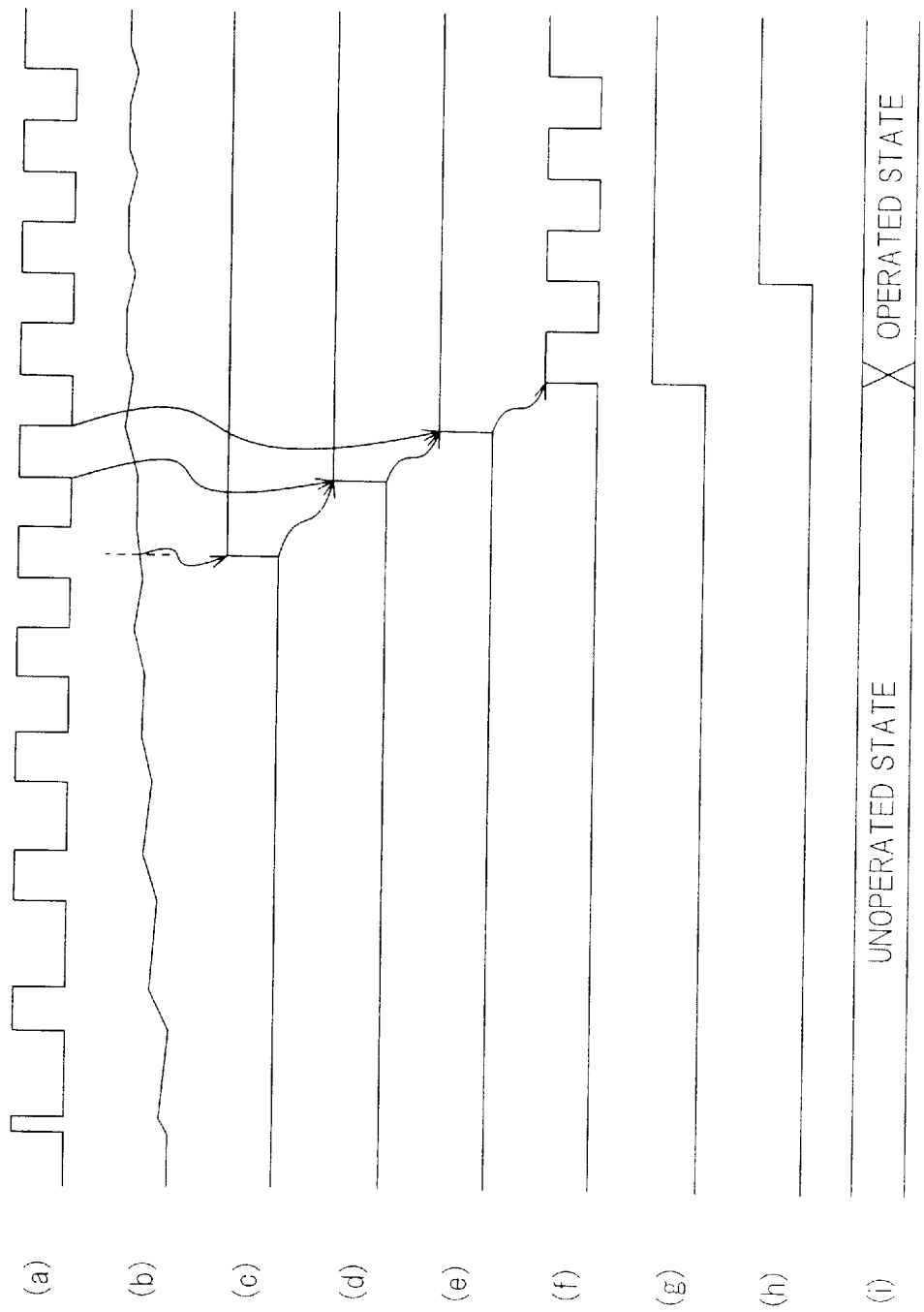
FIG. 11 is a timing chart showing the operations of the clock signal control device in FIG. 10.

FIG. 11 shows timing including signal of the reset circuit 105 for clock-signal-operated circuit. In FIG. 11, (a) shows output of the oscillator, (b) shows output of the rate-voltage converter, (c) shows pulse-rate detecting signal, (d) shows internal signal A in the clock signal supply selecting circuit, (e) shows internal signal B in the clock signal supply selecting circuit, (f) shows supply clock signal, (g) shows reset output A of the clock-operated circuit, (h) shows reset output B of the clock-operated circuit, and (i) shows state of the clock-operated circuit. Signal delayed by the D flip-flop 1051 in FIG. 10 corresponds to reset output A of the clock-signal-operated circuit in FIG. 11(g), and signal delayed by the D flip-flop 1052 corresponds to reset output B of the clock-signal-operated circuit in FIG. 11(h). After the supply clock signal 506 is supplied from these two D flip-flops, a reset period of one clock signal can be obtained. The clock-signal-operated circuit 104 can reset its circuits by the first clock signal and the rising of the second clock signal in the supply clock signal 506.

Next, a clock signal control device in the second preferred embodiment of the invention will be explained.

FIG. 1 shows one circuit composition where the device of this invention is actually composed. The circuit operation of a unit including the oscillator 1 101, oscillator 2 111 . . . or oscillator n 121 was explained referring to FIG. 3.

Figure 12:
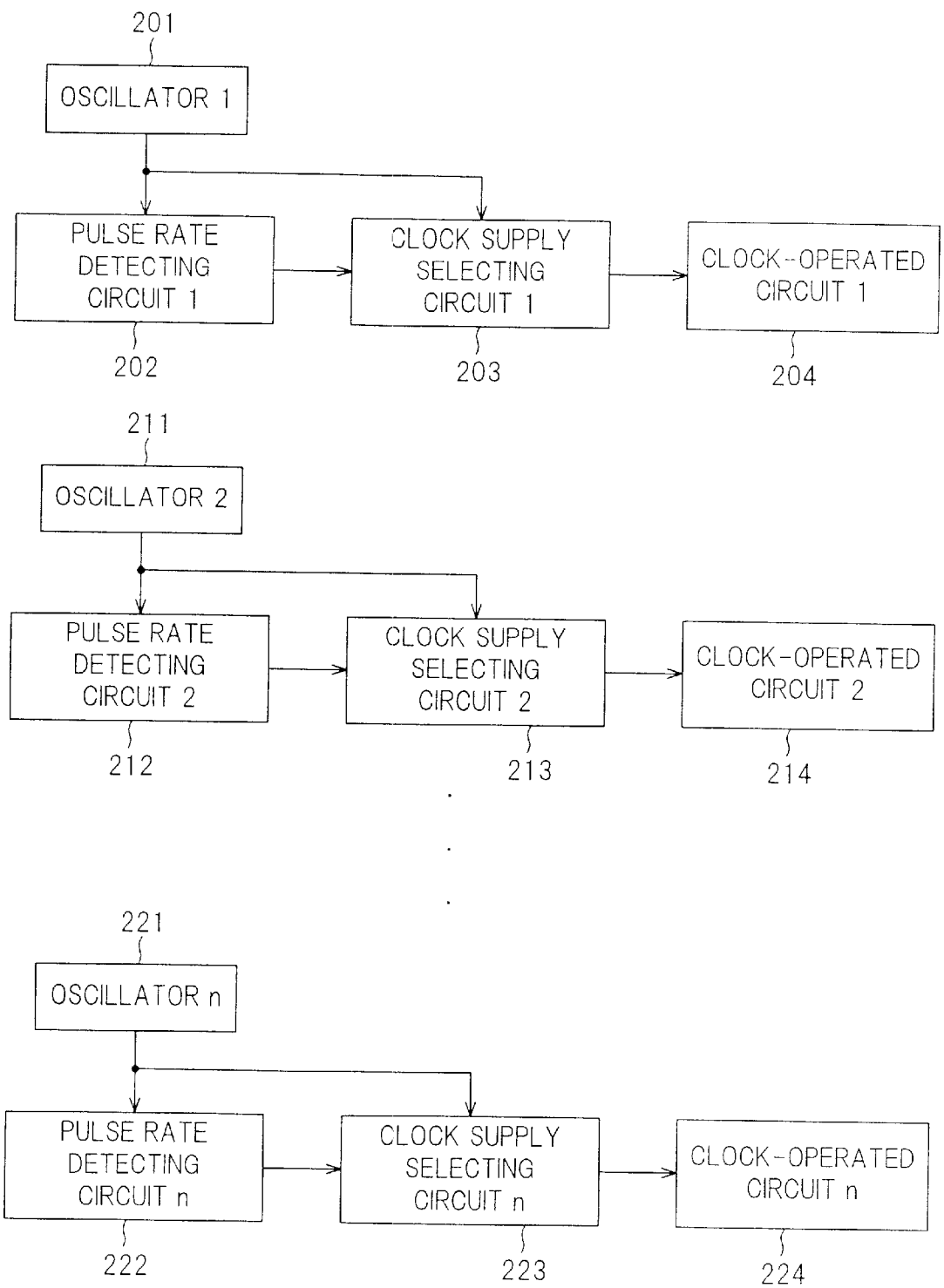
FIG. 12 is a block diagram showing the composition of a clock signal control device in a second preferred embodiment according to the invention.

However, for the actual circuit in composing a device, it is rare that it has only one clock-signal-operated circuit, and it is mostly composed of several kinds of clock-signal-operated circuits. FIG. 12 shows a composition of device in such a case.

Referring to FIG. 12, the clock signal control device in the second embodiment is composed of n units. Each unit is composed similarly to the clock signal control device in FIG. 1. Namely, a first unit comprises oscillator 1 201, pulse rate detecting circuit 1 202, clock signal supply selecting circuit 1 203, and clock-signal-operated circuit 1 204. A second unit comprises oscillator 2 211, pulse rate detecting circuit 2 212, clock signal supply selecting circuit 2 213, and clock-signal-operated circuit 2 214. An n-th unit comprises oscillator n 221, pulse rate detecting circuit n 222, clock signal supply selecting circuit n 223, and clock-signal-operated circuit n 224.

Thus, in the clock signal control device of the second embodiment, each unit has the clock-signal-operated circuit. Also, it has the oscillator for each oscillation frequency needed.

The clock-signal-operated circuits 204, 214, 224 are a circuit whose operation is determined in response to a clock signal, i.e., a unit such as CPU (central processing unit) that operates by the supply of clock signal.

The oscillators 201, 211, 221 comprise a circuit unit to oscillate in a constant cycle, such as a crystal oscillator, a CR oscillator, a SAW (surface acoustic wave) oscillator etc. However, it may be any of circuits with electrical oscillation.

The pulse rate detecting circuits 202, 212, 222 detect a ratio of low-level time width and high-level time width in oscillation of the oscillator.

The clock signal supply selecting circuit 203, 213, 223 determine whether to supply a clock signal as output of the oscillators 201, 211, 221 to the clock-signal-operated circuits 204, 214, 224 or not, based on the output result of the pulse rate detecting circuits 202, 212, 222.

The oscillator 1 201 supplies clock signal to the clock-signal-operated circuit 1 204, and the oscillator 2 211 supplies clock signal to the clock-signal-operated circuit 2 214.

In this case, each of the oscillators 201, 211, 221 operates independently. When the clock-signal-operated circuit 1 204 has to operate over the entire system, the oscillator 1 201 is operated. Hereupon, the pulse rate detecting circuit 1 202 gives an output to match with the oscillation frequency of the oscillator 1 201 by internal rate-voltage converter 1021.

Further, when it is determined that the output level reaches a predetermined level based on the comparator of the voltage detector 1022, a 'valid' signal to indicate that the clock signal of the oscillator 1 201 can be supplied to the clock-signal-operated circuit 1 204 is output to the clock signal supply selecting circuit 1 203. The clock signal supply selecting circuit 1 203 synchronizes clock signal to be supplied to the clock-signal-operated circuit 1 204 with the clock signal of the oscillator 101, then supplying it to the clock-signal-operated circuit 1 204.

Similar operations can be also conducted in the unit composed of the oscillator 2 211, pulse rate detecting circuit 2 212, clock signal supply selecting circuit 2 213 and clock-signal-operated circuit 2 214, and in the unit composed of the oscillator n 221, pulse rate detecting circuit n 222, clock signal supply selecting circuit n 223 and clock-signal-operated circuit n 224.

Next, a clock signal control device in the third preferred embodiment of the invention will be explained.

Figure 13:
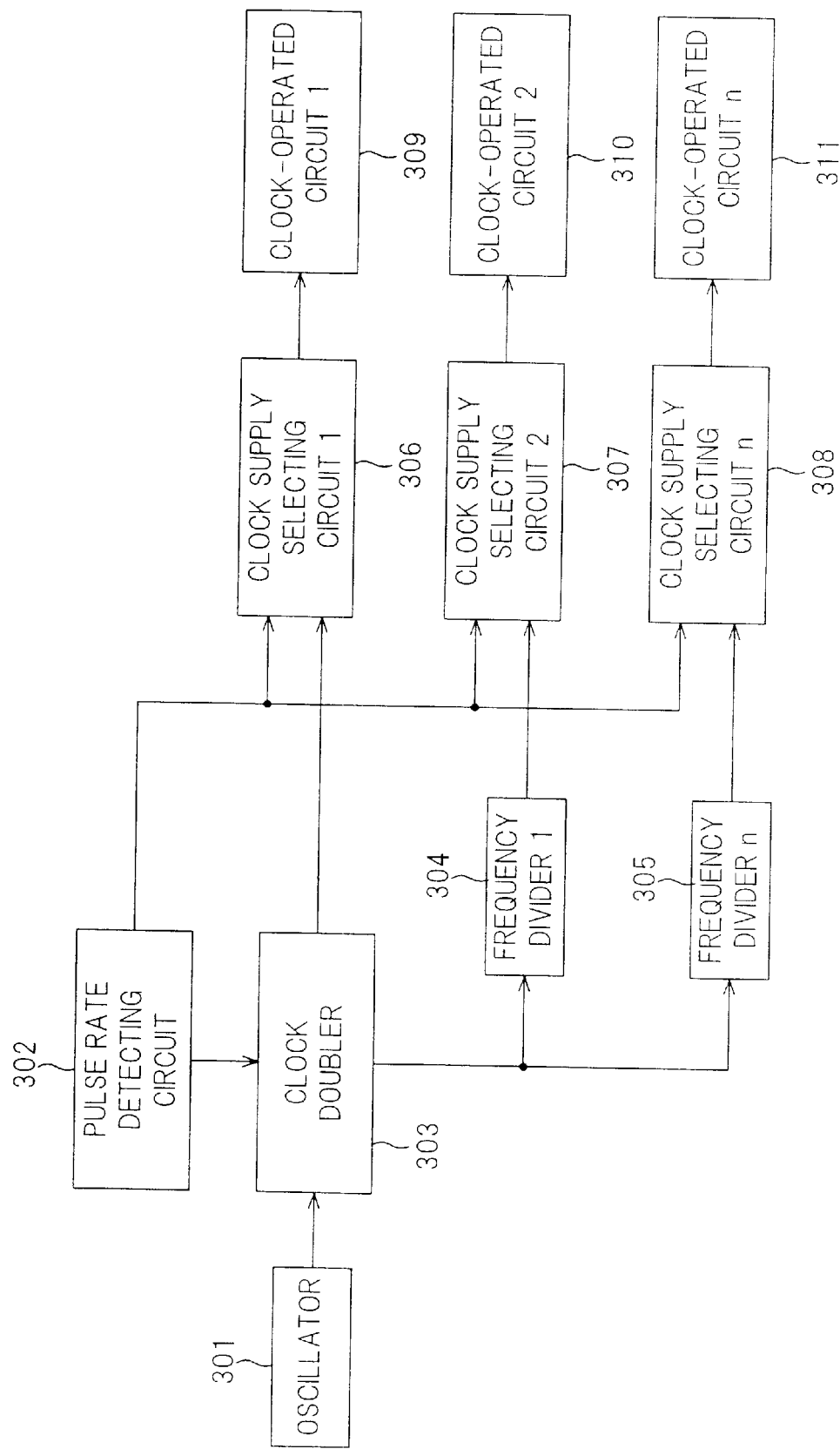
FIG. 13 is a block diagram showing the composition of a clock signal control device in a third preferred embodiment according to the invention.

FIG. 13 shows a composition of the clock signal control device in the third preferred embodiment of the invention. The composition in FIG. 13 is an example of circuit composition where one oscillator 301 is used for several kinds of clock-signal-operated circuits to be operated. The clock-signal-operated circuits include a clock-signal-operated circuit 1 309, a clock-signal-operated circuit 2 310 and a clock-signal-operated circuit n 311.

In this embodiment, the frequency of oscillator is lower than that used in the clock-signal-operated circuits. Because of this, clock signal is increased to a higher frequency by a clock signal doubler, frequency-divided by a frequency divider, supplied to each unit. Of course, an oscillator with a high oscillation frequency may be used, and this clock signal may be frequency-divided, then supplied to each of the clock-signal-operated circuits. However, since the consumed power increases in general when the oscillation circuit using an oscillator has a high frequency, it is typical to take the method that the frequency of clock signal is increased using a doubler circuit such as PLL (phase locked loop), the doubled frequency is then frequency-divided, put to use. Alternatively, without using the frequency divider, the doubler may be used for each of the clock-signal-operated circuits.

Here, it is taken the method that the frequency of clock signal is doubled to a frequency as the least common of clock signal frequencies for clock-signal-operated circuits that are generally used, and the other frequency is then produced by dividing the clock signal.

The oscillator 301 may be an oscillator using a crystal oscillator, a SAW (surface acoustic wave) oscillator etc., or a clock signal module. The clock signal doubler 303 is composed of a circuit that produces a higher frequency than that of the clock signal of the oscillator 301. The pulse rate detecting circuit 302 is the same circuit as the pulse rate detecting circuit 102 in FIG. 1. Also, this circuit can be composed of the combination of frequency counter and frequency variation detector.

When the output of the pulse rate detecting circuit 302 becomes 'valid', a clock signal supply selecting circuit 1 306 supplies the clock signal output of the clock signal doubler 303 to the clock-signal-operated circuit 1 309, enabling this circuit to operate. Similarly, when the output of the pulse rate detecting circuit 302 becomes 'valid', a clock signal supply selecting circuit 2 307 supplies the clock signal output of a frequency divider 1 304 to the clock-signal-operated circuit 2 310, enabling this circuit to operate. Also, in like manner, when the output of the pulse rate detecting circuit 302 becomes 'valid', a clock signal supply selecting circuit n 308 supplies the clock signal output of a is frequency divider n 305 to the clock-signal-operated circuit n 311, enabling this circuit to operate.

Next, a clock signal control device in the fourth preferred embodiment of the invention will be explained.

Figure 14:
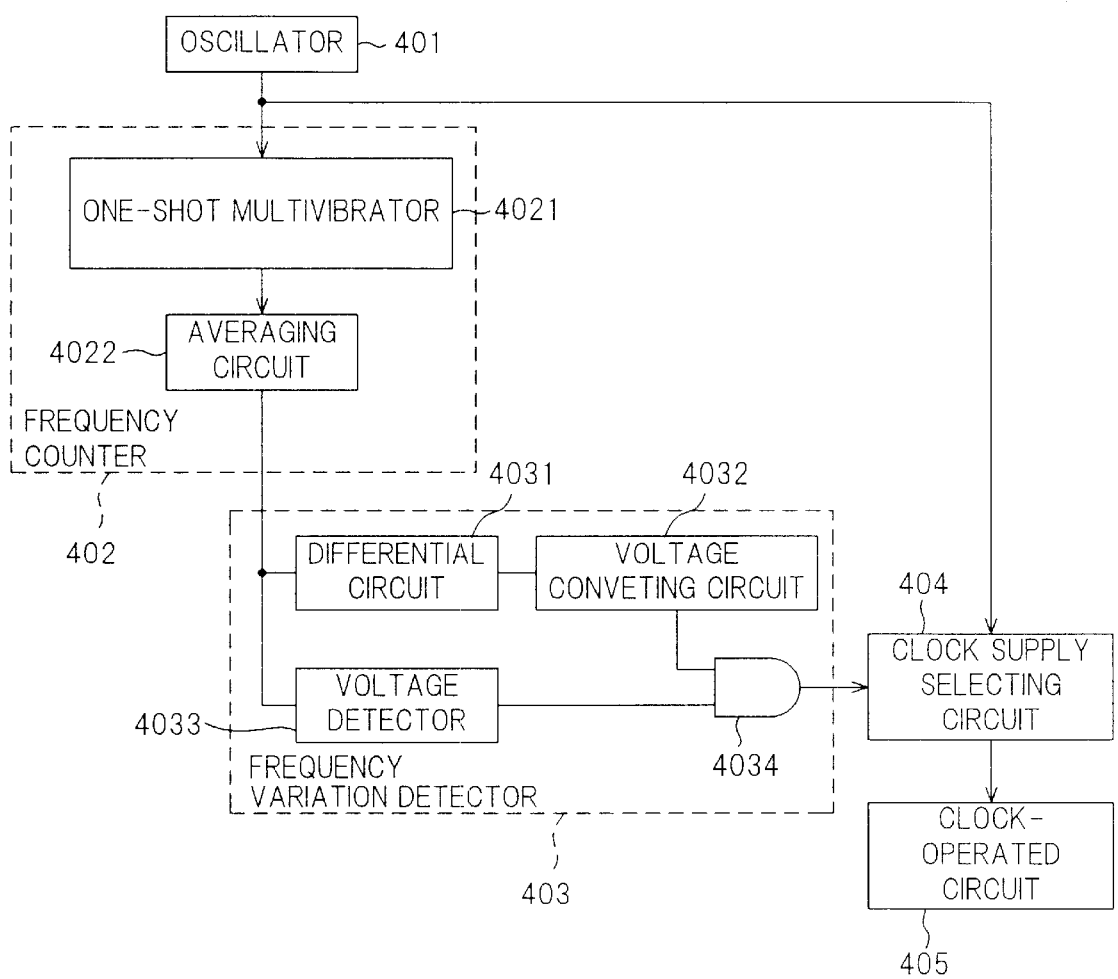
FIG. 14 is a block diagram showing the composition of a clock signal control device in a fourth preferred embodiment according to the invention.

FIG. 14 shows a composition of the clock signal control device in the fourth preferred embodiment of the invention. Referring to FIG. 14, the clock signal control device in the fourth embodiment is composed of an oscillator 401, a frequency counter 402, a frequency variation detector 403, a clock signal supply selecting circuit 404, and a clock-signal-operated circuit 405.

The oscillator 401 may be an oscillator using a crystal oscillator, a SAW (surface acoustic wave) oscillator etc., like the first to third embodiments.

The frequency counter 402 is composed of a one-shot multivibrator 4021 and an averaging circuit 4022. The one-shot multivibrator 4021 may use a standard logic IC, 4538B, etc. or may be composed of an operational amplifier and a transistor.

The averaging circuit 4022 is composed using such a circuit as shown in FIGS. 4 and 5.

Figure 15:
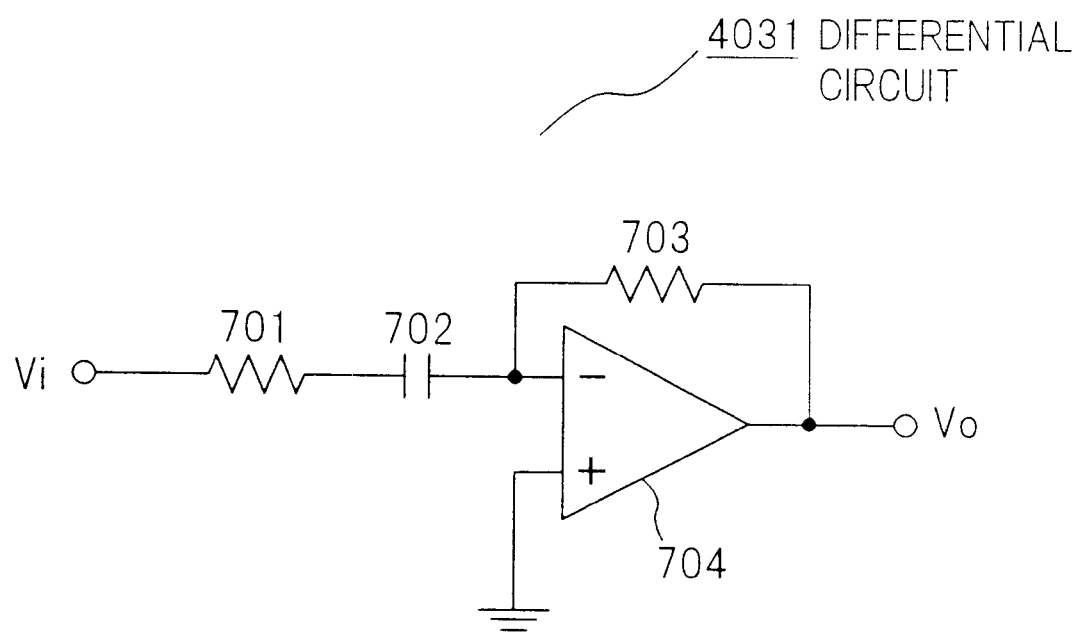
FIG. 15 is a circuit diagram showing a differential circuit 4031 in FIG. 14.

The frequency variation detector 403 is composed of a differential circuit 4031, a voltage converting circuit 4032, a voltage detector 4033, and an AND circuit 4034. The differential circuit 4031 is composed using such a differential circuit as shown in FIG. 15. In this case, a complete type of differential circuit will possibly be responsive to a radio frequency noise. Therefore, a differential circuit of type that is unresponsive to a radio frequency noise is used.

Namely, voltage Vi is input through the series circuit of a resistor 701 and a capacitor 702 to the inversion input of an operational amplifier 704. The non-inversion input of the operational amplifier 704 is grounded. Output Vo of the operational amplifier 704 is feedbacked through a resistor 703 to the inversion input.

Further, since the differential circuit 4031 outputs a signal to indicate 'stable state' when there is no variation of frequency, it must output the same result as if the oscillator 401 oscillates stably even when the oscillator 401 does not oscillate. To avoid such influence, by using the voltage detector 4033 using the same circuit as the voltage detector in FIG. 2, the output of the frequency variation detector 403 is made not to be 'valid' when the output of the frequency counter 402 does not come to a predetermined frequency. Namely, when there is no variation in input signal of the differential circuit 4031 and the signal to indicate being higher than a predetermined voltage by the voltage detector 4033 is 'valid', the frequency variation detector 403 outputs the signal to indicate that the oscillator 401 oscillates stably.

This signal is obtained by carrying out the AND operation between the output result of the differential circuit 4031 and the output result of the voltage detector 4033.

Also, since the unaltered output of the differential circuit 4031 does not match the voltage level of the AND circuit 4034, logic circuit, it is voltage-converted by the voltage converting circuit 4032 composed of the P-channel MOSFET 10225 and N-channel MOSFET 10226 in FIG. 6.

In this way, the pulse rate detecting circuit 102 in FIG. 1 is, as shown in FIG. 14, replaced by the circuit composed of the frequency counter 402 and frequency variation detector 403, and the same effect can be thereby obtained.

ADVANTAGES OF THE INVENTION

As described above, the clock signal control device of the invention is provided with the circuit to detect that the oscillator oscillates stably, determining whether to supply clock signal to the circuit or not, based on the output of this detection circuit, the clock signal is supplied to the circuit only when the supply of clock signal is allowed.

In this way, by providing the circuit to detect whether the oscillator oscillates stably or not, the wrong operation due to unstable output of the oscillator at just after turning on the power supply can be avoided.

Also, to check whether the oscillator oscillates stably, the frequency counter is used to detect the variation of frequency, and the supply of clock signal is allowed when this variation is within a certain range. Thereby, stable clock signal can be supplied and the wrong operation due to unstable clock signal is avoided.

Alternatively, to check whether the oscillator oscillates stably, the pulse rate of clock signal of the oscillator is detected, and the supply of clock signal to the circuit is allowed when this pulse duty falls around 50%. Thus, clock signal is supplied to the system after the clock signal is stabilized.

By these means, in this invention, the wrong operation of system due to unstable clock signal occurring when turning on the power supply or when again supplying clock signal after stopping the supply of clock signal can be avoided.

In this way, by determining whether to allow the supply of clock signal or not based on the duty of clock signal from the oscillator, in such a circuit that its stable operation depends on the pulse rate of clock signal, the wrong operation of system due to unstable output of the oscillator at just after turning on the power supply can be avoided.

Also, for a device to boot the system immediately when the power supply is turned on, like a portable terminal etc. to be operated by dry cell, where the consumed power is reduced by stopping the operation of oscillator to end the supply of clock signal to the clock-signal-operated circuit, such a system that boots without conducting the resetting when the power supply is turned on can be built by supplying only stable clock signal.

The reason is that the power-off state of device can be made by stopping the supply of clock signal without stopping the power supplying to device, and that rebooting can be therefore conducted without losing retained data in register etc.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A clock signal control device, comprising:
   an oscillator which generates a clock signal;
   a pulse detecting circuit which detects stability of the frequency or duty cycle of said clock signal and outputs a control signal based on the result of detection; and
   a clock signal supply selecting circuit which generates a supply clock signal from said clock signal generated from said oscillator in response to said control signal from said pulse detecting circuit.

2. A clock signal control device, according to claim 1, wherein:
   said pulse detecting circuit comprises:
   a pulse voltage converter which outputs an output voltage corresponding to said duty of said clock signal; and
   a voltage detector which outputs said control signal when said output voltage from said pulse voltage converter is higher than a predetermined level.

3. A clock signal control device, according to claim 2, wherein:
   said voltage detector has hysteresis characteristic.

4. A clock signal control device, according to claim 3, wherein:
   said pulse voltage converter comprises:
   a pump circuit which charges a capacitor in response to said clock signal from said oscillator; and
   an averaging circuit which outputs an analogue voltage corresponding to the voltage of said capacitor.

5. A clock signal control device, according to claim 3, wherein:
   said pulse voltage converter comprises:
   an averaging circuit which outputs an analogue voltage in response to said clock signal from said oscillator.

6. A clock signal control device, according to claim 3, wherein:
   said clock signal supply selecting circuit comprises:
   an AND gate circuit which calculates the logical addition between said control signal form said pulse detecting circuit and said clock signal from said oscillator and outputs the result of calculation as said supply clock signal.

7. A clock signal control device, according to claim 6, wherein:
   said clock signal supply selecting circuit further comprises:
   a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

8. A clock signal control device, according to claim 3, wherein:
   said oscillator comprises:
   an oscillation circuit which conducts electrical oscillation; and
   a frequency doubling circuit which doubles the frequency of said oscillation circuit.

9. A portable telephone, comprising said clock signal control device defined by claim 3.

10. A system, comprising a plurality of said clock signal control device defined by claim 3.

11. A clock signal control device, according to claim 10, wherein:
    said oscillator comprises:
    an oscillation circuit which conducts electrical oscillation; and
    a frequency doubling circuit which doubles the frequency of said oscillation circuit.

12. A clock signal control device, according to claim 11, wherein:
    at least one of said plurality of clock signal control device comprises a frequency-dividing circuit which frequency-divides said clock signal from said oscillator and outputs the frequency-divided clock signal to said pulse detecting circuit.

13. A clock signal control device, according to claim 10, wherein:
   at least one of said plurality of clock signal control device comprises a frequency-dividing circuit which frequency-divides said clock signal from said oscillator and outputs the frequency-divided clock signal to said pulse detecting circuit.

14. A clock signal control device, according to claim 2, wherein:
   said pulse voltage converter comprises:
      a pump circuit which charges a capacitor in response to said clock signal from said oscillator; and
      an averaging circuit which outputs an analogue voltage corresponding to the voltage of said capacitor.

15. A clock signal control device, according to claim 14, wherein:
   said clock signal supply selecting circuit comprises:
      an AND gate circuit which calculates the logical addition between said control signal form said pulse detecting circuit and said clock signal from said oscillator and outputs the result of calculation as said supply clock signal.

16. A clock signal control device, according to claim 15, wherein:
   said clock signal supply selecting circuit further comprises:
      a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

17. A clock signal control device, according to claim 14, wherein:
   said oscillator comprises:
      an oscillation circuit which conducts electrical oscillation; and
      a frequency doubling circuit which doubles the frequency of said oscillation circuit.

18. A portable telephone, comprising said clock signal control device defined by claim 14.

19. A system, comprising a plurality of said clock signal control device defined by claim 14.

20. A clock signal control device, according to claim 19, wherein:
   said oscillator comprises:
      an oscillation circuit which conducts electrical oscillation; and
      a frequency doubling circuit which doubles the frequency of said oscillation circuit.

21. A clock signal control device, according to claim 20, wherein:
   at least one of said plurality of clock signal control device comprises a frequency-dividing circuit which frequency-divides said clock signal from said oscillator and outputs the frequency-divided clock signal to said pulse detecting circuit.

22. A clock signal control device, according to claim 19, wherein:
   at least one of said plurality of clock signal control device comprises a frequency-dividing circuit which frequency-divides said clock signal from said oscillator and outputs the frequency-divided clock signal to said pulse detecting circuit.

23. A clock signal control device, according to claim 2, wherein:
   said pulse voltage converter comprises:
      an averaging circuit which outputs an analogue voltage in response to said clock signal from said oscillator.

24. A clock signal control device, according to claim 23, wherein:
   said clock signal supply selecting circuit comprises:
      an AND gate circuit which calculates the logical addition between said control signal form said pulse detecting circuit and said clock signal from said oscillator and outputs the result of calculation as said supply clock signal.

25. A clock signal control device, according to claim 24, wherein:
   said clock signal supply selecting circuit further comprises:
      a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

26. A clock signal control device, according to claim 23, wherein:
   said oscillator comprises:
      an oscillation circuit which conducts electrical oscillation; and
      a frequency doubling circuit which doubles the frequency of said oscillation circuit.

27. A portable telephone, comprising said clock signal control device defined by claim 23.

28. A system, comprising a plurality of said clock signal control device defined by claim 23.

29. A clock signal control device, according to claim 28, wherein:
   said oscillator comprises:
      an oscillation circuit which conducts electrical oscillation; and
      a frequency doubling circuit which doubles the frequency of said oscillation circuit.

30. A clock signal control device, according to claim 29, wherein:
   at least one of said plurality of clock signal control device comprises a frequency-dividing circuit which frequency-divides said clock signal from said oscillator and outputs the frequency-divided clock signal to said pulse detecting circuit.

31. A clock signal control device, according to claim 28, wherein:
   at least one of said plurality of clock signal control device comprises a frequency-dividing circuit which frequency-divides said clock signal from said oscillator and outputs the frequency-divided clock signal to said pulse detecting circuit.

32. A clock signal control device, according to claim 2, wherein:
   said clock signal supply selecting circuit comprises:
      an AND gate circuit which calculates the logical addition between said control signal form said pulse detecting circuit and said clock signal from said oscillator and outputs the result of calculation as said supply clock signal.

33. A clock signal control device, according to claim 32, wherein:
   said clock signal supply selecting circuit further comprises:
      a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

34. A clock signal control device, according to claim 2, wherein:
   said oscillator comprises:
      an oscillation circuit which conducts electrical oscillation; and
      a frequency doubling circuit which doubles the frequency of said oscillation circuit.

35. A portable telephone, comprising said clock signal control device defined by claim 2.

36. A system, comprising a plurality of said clock signal control device defined by claim 2.

37. A clock signal control device, according to claim 36, wherein:
   said oscillator comprises:
      an oscillation circuit which conducts electrical oscillation; and
      a frequency doubling circuit which doubles the frequency of said oscillation circuit.

38. A clock signal control device, according to claim 37, wherein:
   at least one of said plurality of clock signal control device comprises a frequency-dividing circuit which frequency-divides said clock signal from said oscillator and outputs the frequency-divided clock signal to said pulse detecting circuit.

39. A clock signal control device, according to claim 36, wherein:
   at least one of said plurality of clock signal control device comprises a frequency-dividing circuit which frequency-divides said clock signal from said oscillator and outputs the frequency-divided clock signal to said pulse detecting circuit.

40. A clock signal control device, according to claim 1, wherein:
   said pulse detecting circuit comprises:
      a frequency counter which outputs an output voltage corresponding to the frequency of said clock signal; and
      a frequency variation detector which outputs said control signal when said output voltage from said frequency counter is higher than a predetermined level.

41. A clock signal control device, according to claim 40, wherein:
   said frequency counter comprises:
      a one-shot multivibrator which generates a pulse in response to the pulse of said clock signal; and
      an averaging circuit which generates an output voltage corresponding to the number of pulses generated by said one-shot multivibrator.

42. A clock signal control device, according to claim 41, wherein:
   said clock signal supply selecting circuit comprises:
      an AND gate circuit which calculates the logical addition between said control signal form said pulse detecting circuit and said clock signal from said oscillator and outputs the result of calculation as said supply clock signal.

43. A clock signal control device, according to claim 42, wherein:
   said clock signal supply selecting circuit further comprises:
      a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

44. A clock signal control device, according to claim 41, wherein:
   said oscillator comprises:
      an oscillation circuit which conducts electrical oscillation; and
      a frequency doubling circuit which doubles the frequency of said oscillation circuit.

45. A portable telephone, comprising said clock signal control device defined by claim 41.

46. A system, comprising a plurality of said clock signal control device defined by claim 41.

47. A clock signal control device, according to claim 46, wherein:
   said oscillator comprises:
      an oscillation circuit which conducts electrical oscillation; and
      a frequency doubling circuit which doubles the frequency of said oscillation circuit.

48. A clock signal control device, according to claim 47, wherein:
   at least one of said plurality of clock signal control device comprises a frequency-dividing circuit which frequency-divides said clock signal from said oscillator and outputs the frequency-divided clock signal to said pulse detecting circuit.

49. A clock signal control device, according to claim 46, wherein:
   at least one of said plurality of clock signal control device comprises a frequency-dividing circuit which frequency-divides said clock signal from said oscillator and outputs the frequency-divided clock signal to said pulse detecting circuit.

50. A clock signal control device, according to claim 40, wherein:
   said frequency variation detector comprises:
      a differential circuit which differentiates said output voltage from said frequency counter;
      a converter which converts the output of said differential circuit into a gate element level; and
      a voltage detector which outputs said control signal when said output voltage from said frequency counter is higher than a predetermined level.

51. A clock signal control device, according to claim 50, wherein:
   said voltage detector has hysteresis characteristic.

52. A clock signal control device, according to claim 51, wherein:
   said clock signal supply selecting circuit comprises:
      an AND gate circuit which calculates the logical addition between said control signal form said pulse detecting circuit and said clock signal from said oscillator and outputs the result of calculation as said supply clock signal.

53. A clock signal control device, according to claim 52, wherein:
said clock signal supply selecting circuit further comprises:
a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

54. A clock signal control device, according to claim 51, wherein:
said oscillator comprises:
an oscillation circuit which conducts electrical oscillation; and
a frequency doubling circuit which doubles the frequency of said oscillation circuit.

55. A portable telephone, comprising said clock signal control device defined by claim 51.

56. A system, comprising a plurality of said clock signal control device defined by claim 51.

57. A clock signal control device, according to claim 56, wherein:
said oscillator comprises:
an oscillation circuit which conducts electrical oscillation; and
a frequency doubling circuit which doubles the frequency of said oscillation circuit.

58. A clock signal control device, according to claim 57, wherein:
at least one of said plurality of clock signal control device comprises a frequency-dividing circuit which frequency-divides said clock signal from said oscillator and outputs the frequency-divided clock signal to said pulse detecting circuit.

59. A clock signal control device, according to claim 56, wherein:
at least one of said plurality of clock signal control device comprises a frequency-dividing circuit which frequency-divides said clock signal from said oscillator and outputs the frequency-divided clock signal to said pulse detecting circuit.

60. A clock signal control device, according to claim 50, wherein:
said clock signal supply selecting circuit comprises:
an AND gate circuit which calculates the logical addition between said control signal form said pulse detecting circuit and said clock signal from said oscillator and outputs the result of calculation as said supply clock signal.

61. A clock signal control device, according to claim 60, wherein:
said clock signal supply selecting circuit further comprises:
a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

62. A clock signal control device, according to claim 50, wherein:
said oscillator comprises:
an oscillation circuit which conducts electrical oscillation; and
a frequency doubling circuit which doubles the frequency of said oscillation circuit.

63. A portable telephone, comprising said clock signal control device defined by claim 50.

64. A system, comprising a plurality of said clock signal control device defined by claim 50.

65. A clock signal control device, according to claim 64, wherein:
said oscillator comprises:
an oscillation circuit which conducts electrical oscillation; and
a frequency doubling circuit which doubles the frequency of said oscillation circuit.

66. A clock signal control device, according to claim 65, wherein:
at least one of said plurality of clock signal control device comprises a frequency-dividing circuit which frequency-divides said clock signal from said oscillator and outputs the frequency-divided clock signal to said pulse detecting circuit.

67. A clock signal control device, according to claim 64, wherein:
at least one of said plurality of clock signal control device comprises a frequency-dividing circuit which frequency-divides said clock signal from said oscillator and outputs the frequency-divided clock signal to said pulse detecting circuit.

68. A clock signal control device, according to claim 40, wherein:
said clock signal supply selecting circuit comprises:
an AND gate circuit which calculates the logical addition between said control signal form said pulse detecting circuit and said clock signal from said oscillator and outputs the result of calculation as said supply clock signal.

69. A clock signal control device, according to claim 68, wherein:
said clock signal supply selecting circuit further comprises:
a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

70. A clock signal control device, according to claim 40, wherein:
said oscillator comprises:
an oscillation circuit which conducts electrical oscillation; and
a frequency doubling circuit which doubles the frequency of said oscillation circuit.

71. A portable telephone, comprising said clock signal control device defined by claim 40.

72. A system, comprising a plurality of said lock signal control device defined by claim 40.

73. A clock signal control device, according to claim 72, wherein:

said oscillator comprises:
an oscillation circuit which conducts electrical oscillation; and
a frequency doubling circuit which doubles the frequency of said oscillation circuit.

74. A clock signal control device, according to claim 73, wherein:

at least one of said plurality of clock signal control device comprises a frequency-dividing circuit which frequency-divides said clock signal from said oscillator and outputs the frequency-divided clock signal to said pulse detecting circuit.

75. A clock signal control device, according to claim 72, wherein:

at least one of said plurality of clock signal control device comprises a frequency-dividing circuit which frequency-divides said clock signal from said oscillator and outputs the frequency-divided clock signal to said pulse detecting circuit.

76. A clock signal control device, according to claim 1, wherein:

said clock signal supply selecting circuit comprises:
an AND gate circuit which calculates the logical addition between said control signal from said pulse detecting circuit and said clock signal from said oscillator and outputs the result of calculation as said supply clock signal.

77. A clock signal control device, according to claim 76, wherein:

said clock signal supply selecting circuit further comprises:
a synchronizing circuit which generates a synchronous control signal to synchronize with said clock signal of said oscillator from said control signal of said pulse detecting circuit; wherein said AND gate circuit calculates the logical addition between said synchronous control signal, instead of said control signal from said pulse detecting circuit, and said clock signal of said oscillator, and outputs the result of calculation as said supply clock signal.

78. A clock signal control device, according to claim 77, wherein:

said synchronizing circuit is enabled to operate by a reset signal.

79. A clock signal control device, according to claim 78, wherein:

said clock signal supply selecting circuit further comprises:
a reset circuit which is enabled to operate in response to said reset signal and outputs said clock signal of said oscillator as a supply reset signal while delaying it.

80. A clock signal control device, according to claim 79, wherein:

said oscillator comprises:
an oscillation circuit which conducts electrical oscillation; and
a frequency doubling circuit which doubles the frequency of said oscillation circuit.

81. A portable telephone, comprising said clock signal control device defined by claim 79.

82. A system, comprising a plurality of said clock signal control device defined by claim 79.

83. A clock signal control device, according to claim 82, wherein:

said oscillator comprises:
an oscillation circuit which conducts electrical oscillation; and
a frequency doubling circuit which doubles the frequency of said oscillation circuit.

84. A clock signal control device, according to claim 78, wherein:

said oscillator comprises:
an oscillation circuit which conducts electrical oscillation; and
a frequency doubling circuit which doubles the frequency of said oscillation circuit.

85. A clock signal control device, according to claim 83, wherein:

at least one of said plurality of clock signal control device comprises a frequency-dividing circuit which frequency-divides said clock signal from said oscillator and outputs the frequency-divided clock signal to said pulse detecting circuit.

86. A clock signal control device, according to claim 82, wherein:

at least one of said plurality of clock signal control device comprises a frequency-dividing circuit which frequency-divides said clock signal from said oscillator and outputs the frequency-divided clock signal to said pulse detecting circuit.

87. A portable telephone, comprising said clock signal control device defined by claim 78.

88. A system, comprising a plurality of said clock signal control device defined by claim 78.

89. A clock signal control device, according to claim 88, wherein:

said oscillator comprises:
an oscillation circuit which conducts electrical oscillation; and
a frequency doubling circuit which doubles the frequency of said oscillation circuit.

90. A clock signal control device, according to claim 89, wherein:

at least one of said plurality of clock signal control device comprises a frequency-dividing circuit which frequency-divides said clock signal from said oscillator and outputs the frequency-divided clock signal to said pulse detecting circuit.

91. A clock signal control device, according to claim 88, wherein:

at least one of said plurality of clock signal control device comprises a frequency-dividing circuit which frequency-divides said clock signal from said oscillator and outputs the frequency-divided clock signal to said pulse detecting circuit.

92. A clock signal control device, according to claim 77, wherein:

said oscillator comprises:
an oscillation circuit which conducts electrical oscillation; and
a frequency doubling circuit which doubles the frequency of said oscillation circuit.

93. A portable telephone, comprising said clock signal control device defined by claim 77.

94. A system, comprising a plurality of said clock signal control device defined by claim 77.

95. A clock signal control device, according to claim 94, wherein:
said oscillator comprises:
an oscillation circuit which conducts electrical oscillation; and
a frequency doubling circuit which doubles the frequency of said oscillation circuit.

96. A clock signal control device, according to claim 95, wherein:
at least one of said plurality of clock signal control device comprises a frequency-dividing circuit which frequency-divides said clock signal from said oscillator and outputs the frequency-divided clock signal to said pulse detecting circuit.

97. A clock signal control device, according to claim 94, wherein:
at least one of said plurality of clock signal control device comprises a frequency-dividing circuit which frequency-divides said clock signal from said oscillator and outputs the frequency-divided clock signal to said pulse detecting circuit.

98. A clock signal control device, according to claim 76, wherein:
said oscillator comprises:
an oscillation circuit which conducts electrical oscillation; and
a frequency doubling circuit which doubles the frequency of said oscillation circuit.

99. A portable telephone, comprising said clock signal control device defined by claim 76.

100. A system, comprising a plurality of said clock signal control device defined by claim 76.

101. A clock signal control device, according to claim 100, wherein:
said oscillator comprises:
an oscillation circuit which conducts electrical oscillation; and
a frequency doubling circuit which doubles the frequency of said oscillation circuit.

102. A clock signal control device, according to claim 101, wherein:
at least one of said plurality of clock signal control device comprises a frequency-dividing circuit which frequency-divides said clock signal from said oscillator and outputs the frequency-divided clock signal to said pulse detecting circuit.

103. A clock signal control device, according to claim 100, wherein:
at least one of said plurality of clock signal control device comprises a frequency-dividing circuit which frequency-divides said clock signal from said oscillator and outputs the frequency-divided clock signal to said pulse detecting circuit.

104. A clock signal control device, according to claim 1, wherein:
said oscillator comprises:
an oscillation circuit which conducts electrical oscillation; and
a frequency doubling circuit which doubles the frequency of said oscillation circuit.

105. A portable telephone, comprising said clock signal control device defined by claim 104.

106. A portable telephone, comprising said clock signal control device defined by claim 1.

107. A system, comprising a plurality of said clock signal control device defined by claim 1.

108. A clock signal control device, according to claim 107, wherein:
said oscillator comprises:
an oscillation circuit which conducts electrical oscillation; and
a frequency doubling circuit which doubles the frequency of said oscillation circuit.

109. A clock signal control device, according to claim 108, wherein:
at least one of said plurality of clock signal control device comprises a frequency-dividing circuit which frequency-divides said clock signal from said oscillator and outputs the frequency-divided clock signal to said pulse detecting circuit.

110. A clock signal control device, according to claim 107, wherein:
at least one of said plurality of clock signal control device comprises a frequency-dividing circuit which frequency-divides said clock signal from said oscillator and outputs the frequency-divided clock signal to said pulse detecting circuit.

* * * * *